United States Patent
Molas et al.

(10) Patent No.: US 12,414,485 B2
(45) Date of Patent: Sep. 9, 2025

(54) METHOD FOR MANUFACTURING AN OXRAM-TYPE RESISTIVE MEMORY CELL AND ASSOCIATED OXRAM-TYPE MEMORY CELL

(71) Applicants: COMMISSARIAT A L'ENERGIE ATOMIQUE ET AUX ENERGIES ALTERNATIVES, Paris (FR); WEEBIT NANO LTD, Hod Hasharon (IL)

(72) Inventors: Gabriel Molas, Grenoble (FR); Anthonin Verdy, Grenoble (FR); Jean-Baptiste Dory, Grenoble (FR); Jean-François Nodin, Grenoble (FR)

(73) Assignees: COMMISSARIAT A L'ENERGIE ATOMIQUE ET AUX ENERGIES ALTERNATIVES, Paris (FR); WEEBIT NANO LTD, Hod Hasharon (IL)

( * ) Notice: Subject to any disclaimer, the term of this patent is extended or adjusted under 35 U.S.C. 154(b) by 0 days.

(21) Appl. No.: 18/985,575

(22) Filed: Dec. 18, 2024

(65) Prior Publication Data
US 2025/0204285 A1    Jun. 19, 2025

(30) Foreign Application Priority Data
Dec. 18, 2023  (FR) ...................... 2314400

(51) Int. Cl.
*H10N 70/20* (2023.01)
*H10B 63/00* (2023.01)
*H10N 70/00* (2023.01)

(52) U.S. Cl.
CPC ........... *H10N 70/841* (2023.02); *H10B 63/00* (2023.02); *H10N 70/011* (2023.02); *H10N 70/24* (2023.02); *H10N 70/8833* (2023.02)

(58) Field of Classification Search
CPC . H10N 70/841; H10N 70/8833; H10N 70/011
See application file for complete search history.

(56) References Cited

U.S. PATENT DOCUMENTS

| | | | |
|---|---|---|---|
| 2012/0149166 A1 | 6/2012 | Park et al. | |
| 2013/0200326 A1 | 8/2013 | Ju et al. | |

(Continued)

FOREIGN PATENT DOCUMENTS

FR    3 059 157 A1    5/2018

OTHER PUBLICATIONS

Preliminary Search Report and Written Opinion as issued in French Patent Application No. FR2314400, dated Jul. 17, 2024.

(Continued)

*Primary Examiner* — Mark V Prenty
(74) *Attorney, Agent, or Firm* — Pillsbury Winthrop Shaw Pittman LLP

(57) ABSTRACT

A method for manufacturing an OxRAM resistive memory cell, includes forming a TiN lower electrode, firstly implanting Si atoms into the lower electrode with a first implantation dose and a first implantation acceleration voltage, the first implantation dose being strictly positive and strictly lower than $0.7 \cdot 10^{14}$ cm$^{-2}$, secondly implanting Si atoms into the lower electrode with a second implantation dose and a second implantation acceleration voltage strictly greater than the first implantation acceleration voltage, the second implantation dose being strictly positive and strictly lower than $0.6 \cdot 10^{14}$ cm$^{-2}$, the first and second acceleration voltages being selected to have an implantation profile following the first and second implantations having a maximum Si concentration at a depth of between 1 and 3 nm from the upper surface of the lower electrode, depositing an active layer onto the lower electrode implanted, depositing an upper electrode onto the active layer.

15 Claims, 7 Drawing Sheets

(56) References Cited

U.S. PATENT DOCUMENTS

2019/0334085 A1    10/2019   Charpin-Nicolle et al.
2022/0158092 A1    5/2022    Adusumilli et al.

OTHER PUBLICATIONS

Search Report as issued in French Patent Application No. FR2314400, dated Jul. 17, 2024.

METHOD FOR MANUFACTURING AN OXRAM-TYPE RESISTIVE MEMORY CELL AND ASSOCIATED OXRAM-TYPE MEMORY CELL

CROSS-REFERENCE TO RELATED APPLICATIONS

This application claims priority to French Patent Application No. 2314400, filed Dec. 18, 2023, the entire content of which is incorporated herein by reference in its entirety.

FIELD

This invention generally relates to the field of microelectronics. It relates more particularly to the field of filament-type non-volatile resistive memories.

In particular, this invention relates to a method for manufacturing an OxRAM-type resistive memory cell. It also relates to such an OxRAM-type resistive memory cell obtained by the manufacturing method.

BACKGROUND

Resistive memories, in particular oxide-based random access memories (OxRAM), are non-volatile memories whose purpose is to replace flash-type memories. In addition to high integration density, they have high operating speed and good compatibility with the manufacturing methods currently used in the microelectronics industry, in particular with the end-of-line (BEOL) method of CMOS (Complementary Metal Oxide Semi-conductor) technology.

OxRAM resistive memories comprise a multitude of memory cells, also called memory points. Each OxRAM memory cell consists of an M-I-M (Metal-Insulator-Metal) capacitor comprising an active material of variable electrical resistance, generally a transition metal oxide (for example, $HfO_2$, $Ta_2O_5$, $TiO_2$ . . . ), disposed between two metal electrodes. The memory cell reversibly switches between two resistance states, which correspond to logic values "0" and "1" used to code an information bit. In some cases, more than two resistance states can be generated, enabling several bits of information to be stored in the same memory cell.

The information is written into the memory cell by switching it from a High Resistance State (HRS), also called the "OFF" state, to a Low Resistance State (LRS), or "ON" state. Conversely, to erase the information from the memory cell, it is switched from the low resistance state ("OFF") to the high resistance state ("ON").

The change in resistance of the memory cell is governed by the formation and breakage of a conductive filament of nanometric cross-section between the two electrodes. This conductive filament is created by virtue of the presence of oxygen vacancies in the active layer of the memory cell. By modifying the potentials applied to the electrodes, it is possible to modify the distribution of the filament, and thus to modify the electrical conduction between the two electrodes. In the active layer, the electrically conductive filament is either broken or, on the contrary, reformed in order to vary the resistance level of the memory cell, during cycles of writing and then resetting this cell (SET operations, when the filament is reformed leading to the LRS state, and RESET operations leading to the HRS state, when the filament is broken again by applying a SET voltage, VSET, or a RESET voltage, VRESET, respectively, across the electrodes).

Immediately after manufacture, the resistive memory cell is in a virgin state characterised by a very high (so-called initial) resistance. This initial resistance is much greater than the resistance of the cell when it is in its high-resistive state. The oxide layer is indeed insulating in its initial state. So that the memory cell can be used, a step known as "forming" has to be achieved. This step consists in a partially reversible breakdown of the oxide in order to generate the conductive filament for the first time (and therefore to place the memory cell in the low-resistive state). After this breakdown, the initially insulating oxide layer becomes active and the cell can switch between the low-resistive state and the high-resistive state by erase and write operations. The forming step is achieved by applying, between the two electrodes of the memory cell, a (so-called "forming") voltage having a value much greater than the nominal operating voltage of the memory cell (used during the next write/erase cycles), for example a voltage in the order of 2.5 V for a nominal voltage in the order of 1.5 V.

The endurance limit of OxRAM memory cells is a crucial requirement, especially for some applications requiring very good endurance limit, beyond 1,000 cycles, or even up to 10,000 cycles (by cycle it is meant a write/erase operation and by endurance limit, the fact that it is still possible to distinguish an HRS state from an LRS state beyond a given number of cycles).

SUMMARY

One or more aspects of the present invention therefore aim at improving OxRAM-type resistive memory cells, especially by improving their endurance limit.

An aspect of the invention then relates to a method for manufacturing an OxRAM-type resistive memory cell, comprising the following steps of:

forming a titanium nitride lower electrode, firstly implanting silicon atoms into the lower electrode with a first implantation dose of silicon and a first implantation acceleration voltage, said first implantation dose of silicon being strictly positive and strictly lower than $0.7 \times 10^{14}$ cm$^{-2}$ secondly implanting silicon atoms into the lower electrode with a second implantation dose of silicon and a second implantation acceleration voltage strictly greater than the first implantation acceleration voltage, said second implantation dose of silicon being strictly positive and strictly lower than $0.6 \cdot 10^{14}$ cm$^{-2}$ the first and second acceleration voltages being selected to have an implantation profile following the first and second implantations having a maximum silicon concentration at a depth of between 1 and 3 nm from the upper surface of the lower electrode, depositing an active layer onto the lower electrode implanted, depositing an upper electrode onto the active layer.

Particularly surprisingly, doping the lower TiN electrode of the OxRAM cell with Si atoms enables the endurance limit of the cell to be considerably improved under some conditions of implantation of Si into the TiN. This unexpected technical effect presupposes, firstly, that two implantations are carried out, one at a lower acceleration voltage of the Si ions aimed at implanting Si at the surface of the lower electrode of the OxRAM cell and the other at a higher acceleration voltage of the Si ions aimed at implanting Si deeper into the lower electrode of the OxRAM cell. It also supposes a particular implantation profile into the lower electrode having a maximum silicon concentration at a depth of between 1 and 3 nm from the upper surface of the lower electrode. It will be seen hereinafter that under such conditions, the bit error rate (BER) on a set of memory cells obtained by the method according to one or more aspects of the invention decreases with the number of cycles, whereas it tends to increase for other types of cells and to have unsatisfactory values for applications requiring significant endurance limits. The lower the error rate, the better the LRS and HRS states are distinguished on the scale of a matrix of memory cells.

By definition, this error rate corresponds to the percentage of memory cells in the set of memory cells under consideration that do not have satisfactory properties.

It should be noted that the order of the first and second implantations can be reversed, so that the first implantation can be carried out before the second, or conversely the second before the first. In an embodiment, however, the first implantation is carried out before the second implantation.

Further to the characteristics just discussed in the preceding paragraphs, the manufacturing method according to one or more embodiments of the invention may have one or more additional characteristics from among the following, considered individually or according to any technically possible combination:

the first and second acceleration voltages are selected to have an implantation profile following the first and second implantations having a maximum silicon concentration at a depth of between 1 and 1.6 nm from the upper surface of the lower electrode and a width of the implantation profile at half the value of the maximum silicon implantation concentration of between 1.6 nm and 2 nm.

the first and second acceleration voltages are selected to have an implantation profile following the first and second implantations having a maximum silicon concentration at a depth of between 1.1 and 1.5 nm from the upper surface of the lower electrode and a width of the implantation profile at half the value of the maximum silicon implantation concentration of between 1.7 nm and 1.9 nm.

depositing the upper electrode onto the active layer comprises:
  Depositing a first conductive layer, in contact with the active layer and being selected to create oxygen vacancies into the active layer, and
  Depositing a second conductive layer disposed onto the first conductive layer.

The material of the first conductive layer is titanium and the conductive material of the second conductive layer is titanium nitride.

the first acceleration voltage is between 0.3 kV and 0.7 kV and the second acceleration voltage is between 1 kV and 2 kV.

the first acceleration voltage is equal to 0.5 kV and the second acceleration voltage is equal to 1.5 kV.

the first implantation dose of silicon is equal to $0.5 \cdot 10^{14}$ cm$^{-2}$ and the second implantation dose of silicon is equal to $0.3 \cdot 10^{14}$ cm$^{-2}$ depositing the active layer onto the lower electrode implanted includes the following steps of:
  depositing an active material layer onto the lower electrode implanted,
  depositing a dielectric oxide layer onto the active material layer,
  implanting silicon atoms through the dielectric oxide layer, the implantation dose and the implantation acceleration voltage being selected so that the silicon atoms are implanted at least partially into the active material layer.

the active material is based on hafnium dioxide.

the dielectric oxide is based on aluminium oxide.

the step of implanting silicon through the dielectric oxide layer is implemented at an implantation acceleration voltage of between 1.5 and 3.5 kilovolts, and in an embodiment equal to 2.5 kV, and an implantation dose of silicon of between $10^{15}$ cm$^{-2}$ and $5 \cdot 10^{15}$ cm$^{-2}$, and in an embodiment equal to $2 \cdot 10^{15}$ cm$^{-2}$ the material of the first conductive layer is titanium and the conductive material of the second conductive layer is titanium nitride.

the thickness of the titanium nitride lower electrode is selected between 10 and 200 nm.

Another aspect of the invention also relates to an OxRAM-type resistive memory cell likely to be obtained by the method according to an aspect of the invention.

At this stage, it is not possible to structurally characterise the OxRAM-type resistive memory cell according to an aspect of the invention other than by its production method. However, the manufacturing method according to an aspect of the invention gives the OxRAM-type memory cell according to an aspect of the invention particularly beneficial endurance properties compared with those of resistive OxRAM-type cells of the state of the art.

BRIEF DESCRIPTION OF THE FIGURES

Further characteristics and benefits of the invention will appear clearly from the description given below, by way of indicating and in no way limiting purposes, with reference to the appended figures, including.

For greater clarity, identical or similar elements are identified by identical reference signs throughout the figures.

DETAILED DESCRIPTION OF AT LEAST ONE EMBODIMENT

Figure 1:
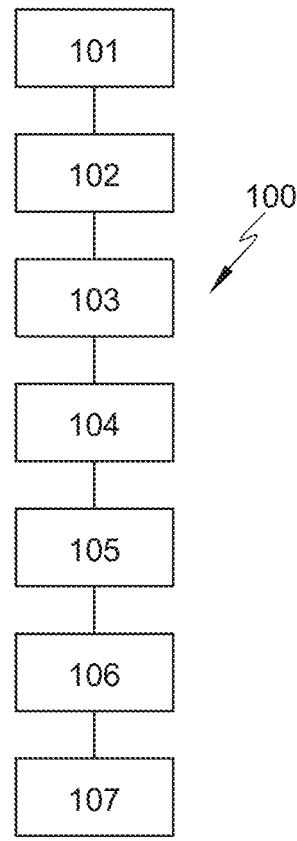
FIG. 1 represents, in the form of a logic diagram, the different steps of the method according to an embodiment of the invention.

FIG. 1 represents the logic diagram illustrating the different steps of the method for manufacturing (100) an OxRAM memory cell according to an aspect of the invention.

Figure 2:
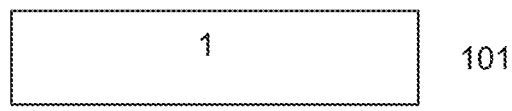
FIG. 2, FIG. 3, FIG. 4, FIG. 5, FIG. 6, FIG. 7 and FIG. 8 represent the different steps of the method of FIG. 1.

As shown in FIG. 2, the method 100 begins with a step 101 of forming a first electrode 1 formed by a titanium nitride layer corresponding to the lower electrode 1 of the OxRAM memory cell. This step therefore aims at forming the lower electrode 1, for example on a substrate (substrate not represented in the figures). The lower electrode 1 has a thickness, for example, of between 10 and 200 nm thick, here 60 nm.

In practice, the lower electrode 1 is formed by reactive sputtering in a vacuum deposition chamber, for example.

Alternatively, the lower electrode 1 can be formed by chemical vapour deposition or according to a damascene structure.

Figure 3:
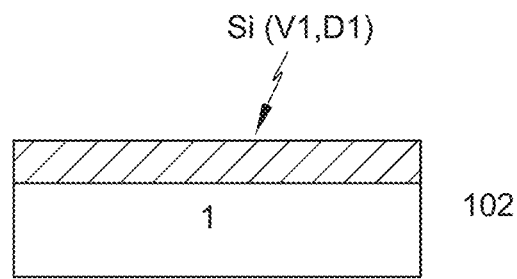

The method 100 continues with a step 102 (FIG. 3) corresponding to a first implantation of silicon atoms Si into the lower electrode 1.

Figure 9:
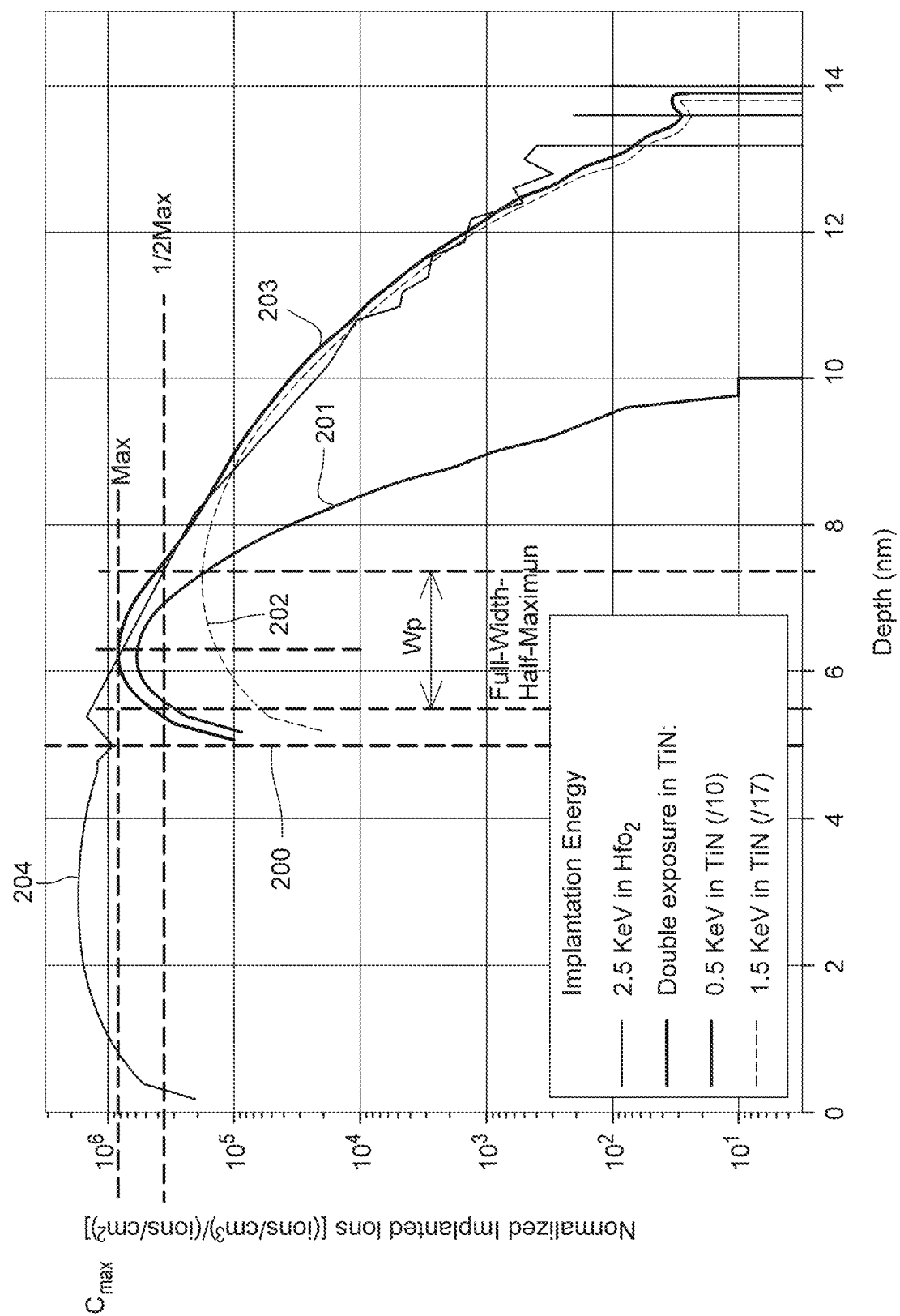
FIG. 9 represents the different implantation profiles into the lower electrode of the OxRAM-type memory cell according to an embodiment of the invention.

According to this first implantation, Si is implanted into the TiN layer of the lower electrode 1 according to a predetermined profile 201 represented in FIG. 9. The implantation dose D1 and the implantation acceleration voltage V1 are selected to obtain implantation at the surface of the lower electrode 1. The implantation dose D1 of silicon is strictly positive and strictly lower than $0.7 \cdot 10^{14}$ cm$^{-2}$; according to an embodiment, the dose D1 is equal to $0.5 \cdot 10^{14}$ cm$^{-2}$. The acceleration voltage V1 of the Si ions is between 0.3 kV and 0.7 kV; according to an embodiment, the acceleration voltage is equal to 0.5 kV.

FIG. 9 especially shows the different implantation profiles in the TiN layer corresponding to the lower electrode 1, the upper surface of which is delimited by the dotted lines 200: the first implantation at the dose D1 and voltage V1 is represented by the profile 201 having a maximum Si concentration at a depth of 1.2 nm from the upper surface of the lower electrode and a width of the implantation profile 201 at half the value of the maximum silicon implantation concentration equal to 1.5 nm. The implantation profiles represent a representative value of the ions implanted in a normalised manner (ratio of the volume concentration of ions implanted to the dose of ions implanted) as a function of the depth in the layers implanted.

Figure 4:
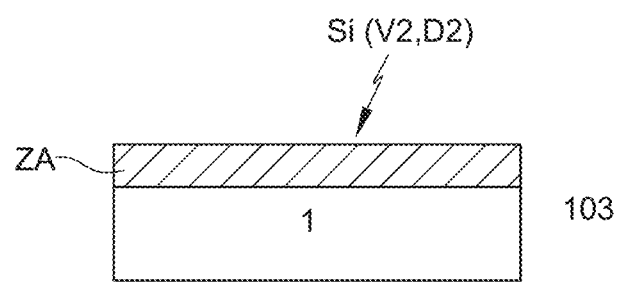

The method 100 continues with a step 103 (FIG. 4) corresponding to a second implantation of silicon Si atoms into the lower electrode 1.

According to this second implantation, Si is implanted into the TiN layer of the lower electrode 1 according to a given profile 202 represented in FIG. 9, having a maximum Si concentration at a depth of 2.2 nm from the upper surface of the lower electrode and a width of the implantation profile at half the value of the maximum silicon implantation concentration equal to 3.0 nm. The implantation dose D2 and the implantation acceleration voltage V2 of this second implantation are selected to obtain a deeper implantation of the lower electrode 1. The implantation dose D2 of silicon is strictly positive and strictly lower than $0.6 \cdot 10^{14}$ cm$^{-2}$; according to an embodiment, the dose D2 is equal to $0.3 \cdot 10^{14}$ cm$^{-2}$. The acceleration voltage V2 of the Si ions is between 1 kV and 2 kV; according to an embodiment, the acceleration voltage is equal to 1.5 kV.

At the end of steps 102 and 103, the overall profile resulting from the first and second implantations is illustrated by the reference 203 showing a maximum silicon concentration Cmax at a depth of between 1 and 3 nm from the upper surface of the lower electrode (and in an embodiment between 1 and 1.6 nm, and still for example between 1.1 and 1.5 nm, and here equal to 1.3 nm) and a width Wp of the implantation profile at half the value of the maximum silicon implantation concentration of between 1.6 nm and 2 nm (and in an embodiment between 1.7 nm and 1.9 nm, and here equal to 1.86 nm). The zone implanted by the first and second implantations of the lower electrode 1 is illustrated by the reference ZA in FIG. 4.

Figure 5:
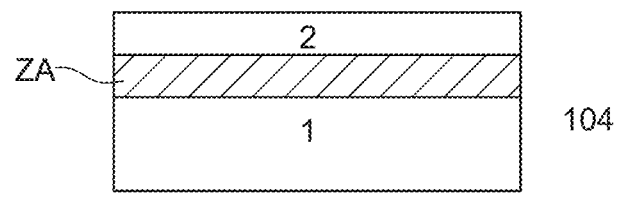

And then, the method continues with a step 104 (FIG. 5) of depositing an active material layer 2. This active material layer 2 is formed on the lower electrode 1. The active material layer 2 is deposited in such a way that this layer has a substantially constant thickness at all points. In this description, by "substantially constant", it is meant a thickness that does not vary by more than 20%, in an embodiment by more than 10%, and still in an embodiment by more than 5%. In an embodiment here, the active material layer 2 is based on amorphous hafnium dioxide $HfO_2$. In this description, it is meant by the term "based on" that the layer concerned comprises more than 50% of the element mentioned after this term (for example here, this means that the active material layer 2 comprises more than 50% hafnium dioxide). The active material layer 2 has a thickness of between 3 and 10 nm, for example 5 nm here.

In practice, the active material layer 2 is deposited using an Atomic Layer Deposition (ALD) method.

Alternatively, the active material layer can be deposited by sputtering. Still alternatively, the active material layer can be deposited by a Physical Vapour Deposition (PVD) method. Still alternatively, the active material layer can be deposited by an Ion Beam Deposition (IBD) method.

Figure 6:
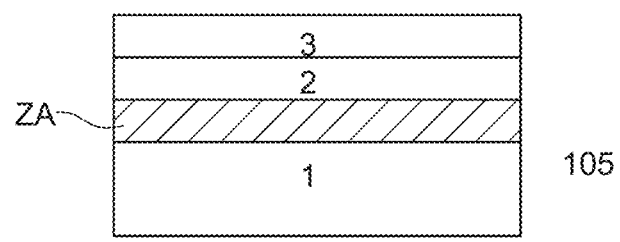

As is represented in FIG. 6, optionally the method 100 continues with the step 105 of depositing a dielectric oxide layer 3. This dielectric oxide layer 3 is formed on the active material layer 2. The dielectric oxide layer 3 comprises, for example, a metal oxide or a semiconducting oxide. In an embodiment, it is aluminium oxide $Al_2O_3$. Alternatively, it can also be silicon dioxide $SiO_2$.

The dielectric oxide layer 3 has a thickness of between 0.3 and 1.5 nm, for example 0.5 nm.

In practice, the dielectric oxide layer 3 is deposited by an atomic layer deposition (or ALD) method. Alternatively, the dielectric oxide layer 3 may be deposited by sputtering. Still alternatively, the dielectric oxide layer can be deposited by a physical vapour deposition (PVD) method. Still alternatively, the dielectric oxide layer can be deposited by an ion beam deposition (IBD) method.

This dielectric oxide layer 3 deposited onto the layer comprising the active material is positioned between the layer comprising the active material and the layer forming the upper electrode. This layer then acts as a diffusion barrier for oxygen vacancies (relative to the filament) and then improves the switching properties of the memory cell. In particular, this configuration makes it possible to improve the implementation of write and erase cycles. As previously indicated, it is possible to dispense with this step 105 of depositing the dielectric oxide layer and go directly from the step 104 of depositing the active material layer to the step 106 of implanting silicon into the active material layer.

Figure 7:
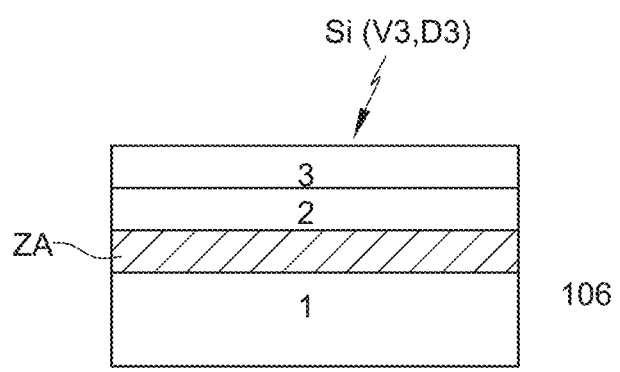

As illustrated in FIG. 7, the method 100 continues with a step 106 of implanting silicon into the active layer formed by the $Al_2O_3$ dielectric oxide layer 3 and the $HfO_2$ active material layer 2 formed in steps 104 and 105. Silicon is implanted according to a specific profile illustrated by the reference 204 in FIG. 9. Thus, according to whether or not the deposition 105 of the dielectric oxide layer takes place, the so-called active layer includes either only the active material layer 2 or a stack of the active material layer and the dielectric oxide layer 3.

Beneficially, the implantation step 106 is implemented at an implantation acceleration voltage V3 of between 1.5 and 3.5 kV, here equal to 2.5 kV, for an implantation dose D3 in the order of $2 \cdot 10^{15}$ cm$^{-2}$.

As shown in FIG. 9, the implantation profile 204 extends into the zone ZA already implanted of the lower electrode 1.

Figure 8:
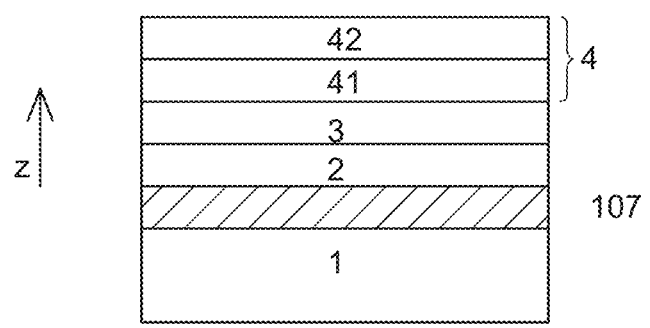

Finally, the method continues with a step 107 of depositing a second electrode 4 forming the upper electrode (FIG. 8). The upper electrode 4 is formed on the active layer formed as previously indicated from the active material layer 2 and the dielectric oxide layer 3. More particularly, the upper electrode 4 is deposited onto the dielectric oxide layer 3.

The upper electrode 4 comprises a first conductive layer 41, for example made of titanium Ti, and a second conductive layer 42, for example made of titanium nitride TiN. The step of depositing the upper electrode 4 here therefore comprises two sub-steps: a first sub-step of depositing the first conductive layer 41 and a second sub-step of depositing the second conductive layer 42.

The first conductive layer 41 is therefore first deposited onto the dielectric oxide layer 3. The first conductive layer 41 is formed, for example, by sputtering in a vacuum deposition chamber.

The first Ti conductive layer 41 has the feature of being a layer adapted to create oxygen vacancies in the active layer when this first conductive layer 41 is in contact with the active layer. According to a commonly used term, the first conductive layer 41 is an "oxygen scavenging layer" type layer. As the mechanism for forming the conductive filament in the dielectric oxide layer 3 generally involves reorganizing the oxygen vacancies within the dielectric oxide, the first conductive layer 41 facilitates oxygen exchanges with the active layer. It should be noted that this first conductive layer 41 makes it possible to create oxygen vacancies in the active material layer 2 even when this first conductive layer is deposited onto the dielectric oxide layer 3. In other words, the first conductive layer 41 creates oxygen vacancies in the active material layer 2 with or without deposition of the dielectric oxide layer 3.

And then, the second conductive layer 42 is deposited onto the first conductive layer 41. The second conductive layer 42 is formed, for example, by reactive sputtering in a vacuum deposition chamber.

The first conductive layer 41 has a thickness of between 3 and 20 nanometres, here 5 nm. The second conductive layer 42 has a thickness of between 10 and 200 nanometres, here 150 nm.

At the end of this step 107, the OxRAM-type memory cell 5 is obtained in the form of a stack of layers extending along an axis z. The lower electrode 1, the active material layer 2, the dielectric oxide layer 3 and the upper electrode 4 form the different layers of this stack. The different layers extend in parallel to each other (and in parallel to a substrate, not represented, on which the memory cell 5 rests). The axis z here is perpendicular to the plane of the different layers of the stack forming the memory cell 5.

The benefits (especially the better endurance performance) of the OxRAM-type memory cell as represented in FIG. 8 will now be shown.

To do this, an indicator, the bit error rate (BER), evaluated on a set of memory cells (here around 16,000 cells) will be used. By definition, this error rate corresponds to the percentage of memory cells in the set of memory cells under consideration that do not have satisfactory properties.

In practice, this error rate is evaluated by representing the distributions of the memory cells in the set under consideration as a function of the resistance R (in Ohm Ω) for the LRS and HRS states. The distributions of the memory cells are here considered cumulatively (it is the Cumulative Distribution Function or CDF). The error rate then corresponds to the point of intersection of the distributions representing the LRS and HRS states.

Figure 10:
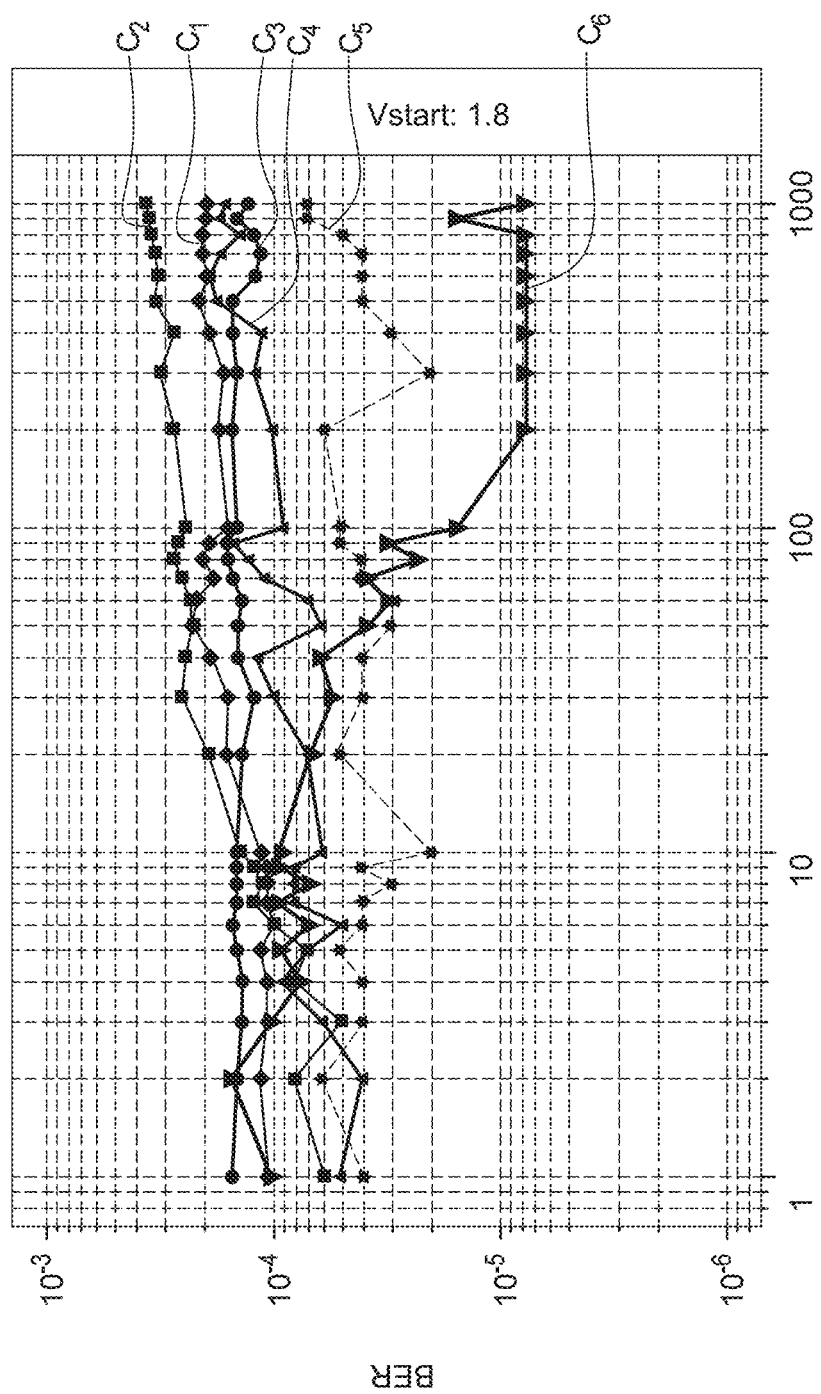
FIG. 10 represents the BER error rate as a function of the number of cycles for different categories of OxRAM-type memory cells, including memory cells according to an embodiment of the invention.

FIG. 10 represents the BER error rate for 6 types of memory cells C1 to C6 as a function of the number of cycles performed on these cells, one cycle corresponding to a set and reset step. C6 type cells are OxRAM-type memory cells according to an embodiment of the invention and as obtained at the end of the method 100 illustrated in FIGS. 1 to 8. The other cells C1 to C5 have a stack of layers identical to C6 type cells and differ from the latter only in the doping of the lower electrode. The implantation characteristics of the lower electrode of cells C6 according to an embodiment of the invention are here reminded:

First implantation at an acceleration voltage of 0.5 kV and an implantation dose of $0.5 \cdot 10^{14}$ cm$^{-2}$.
Second implantation at an acceleration voltage of 1.5 kV and an implantation dose of $0.3 \cdot 10^{14}$ cm$^{-2}$.

C1 type cells have a lower electrode that has undergone a single implantation with a low acceleration voltage (here 0.5 kV) and an implantation dose of $1 \cdot 10^{14}$ cm$^{-2}$.

C2 type cells have a lower electrode that has undergone a double implantation:

First implantation at an acceleration voltage of 0.5 kV and an implantation dose of $1 \cdot 10^{14}$ cm$^{-2}$.
Second implantation at an acceleration voltage of 1.5 kV and an implantation dose of $0.6 \cdot 10^{14}$ cm$^{-2}$.

C3 type cells have a lower electrode that has undergone a double implantation:

First implantation at an acceleration voltage of 0.5 kV and an implantation dose of $1 \cdot 10^{14}$ cm$^{-2}$.
Second implantation at an acceleration voltage of 4 kV and an implantation dose of $7 \cdot 10^{14}$ cm$^{-2}$.

C4 type cells have a lower electrode that has undergone a double implantation:

First implantation at an acceleration voltage of 0.5 kV and an implantation dose of $2 \cdot 10^{14}$ cm$^{-2}$.
Second implantation at an acceleration voltage of 1.5 kV and an implantation dose of $1.2 \cdot 10^{14}$ cm$^{-2}$.

C5 type cells have a lower electrode that has not been implanted.

As illustrated in FIG. 10, apart from the C6 type cells according to an embodiment of the invention, the error rate of all the C1 to C5 type cells degrades with the number of cycles. Conversely, the memory cells according to an embodiment of the invention have an error rate which decreases progressively with the number of cycles until it stabilises at around one hundred cycles. The error rate of the memory cells according to an embodiment of the invention remains basically stable, even after 10,000 cycles, whereas it degrades, including for C5 type cells with a lower electrode not implanted.

Surprisingly, it can be noticed that the simple Si implantation of the lower electrode is not sufficient to improve the endurance performance of an OxRAM-type memory cell, since C1 to C4 type cells also have an implantation of the lower electrode and have degraded endurance performance. It is therefore suitable that the specific implantation conditions of the method according to an embodiment of the invention are carried out in order to obtain the endurance performance of the memory cell according to an embodiment of the invention, the intrinsic characteristics of which cannot be defined at this stage other than by its manufacturing method. It can also be noticed that the error rate of OxRAM-type memory cells according to an embodiment of the invention begins to decrease with the number of cycles. It may therefore be interesting to carry out a preliminary step (after manufacture and before use) consisting in cycling the memory cell according to an embodiment of the invention over a number N of cycles (with N an integer greater than or equal to 100) so as to obtain a lower error rate which then stabilises.

Figure 11:
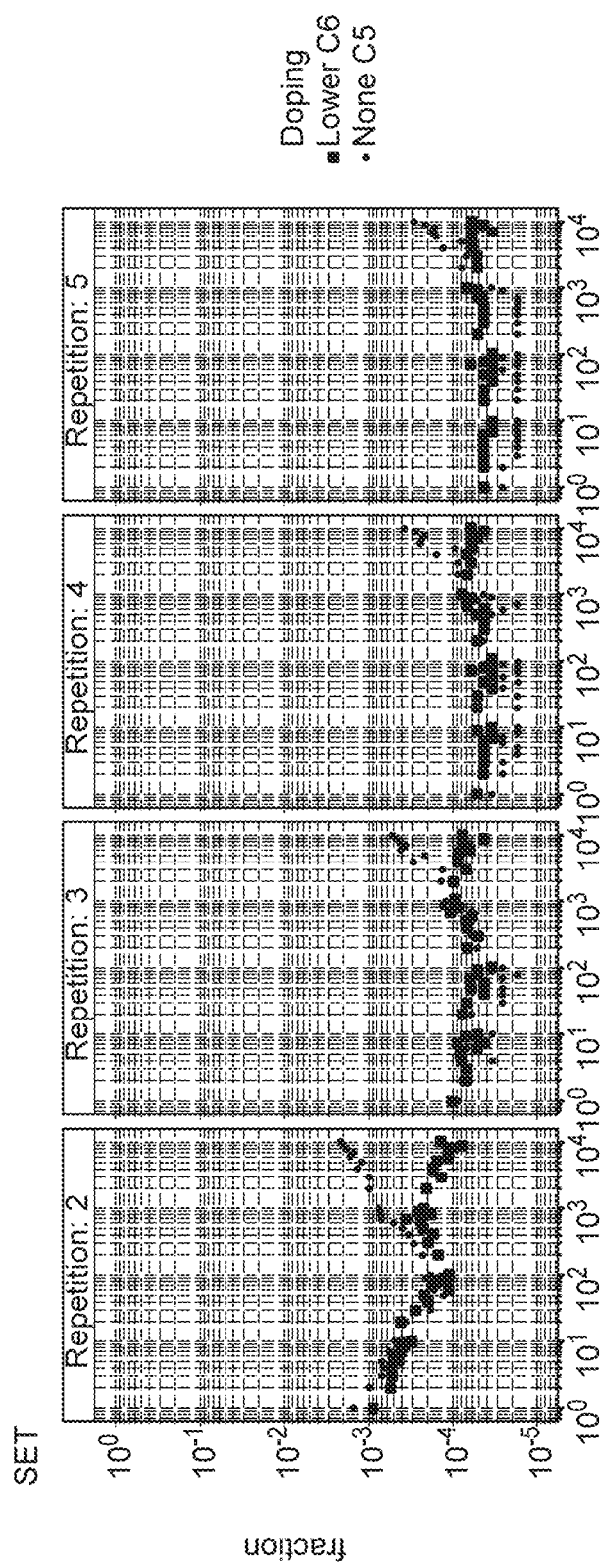
FIG. 11 and FIG. 12 represent the course of the fraction of memory cells requiring one or more programming repetitions, in set and reset, as a function of the number of cycles.
Figure 12:
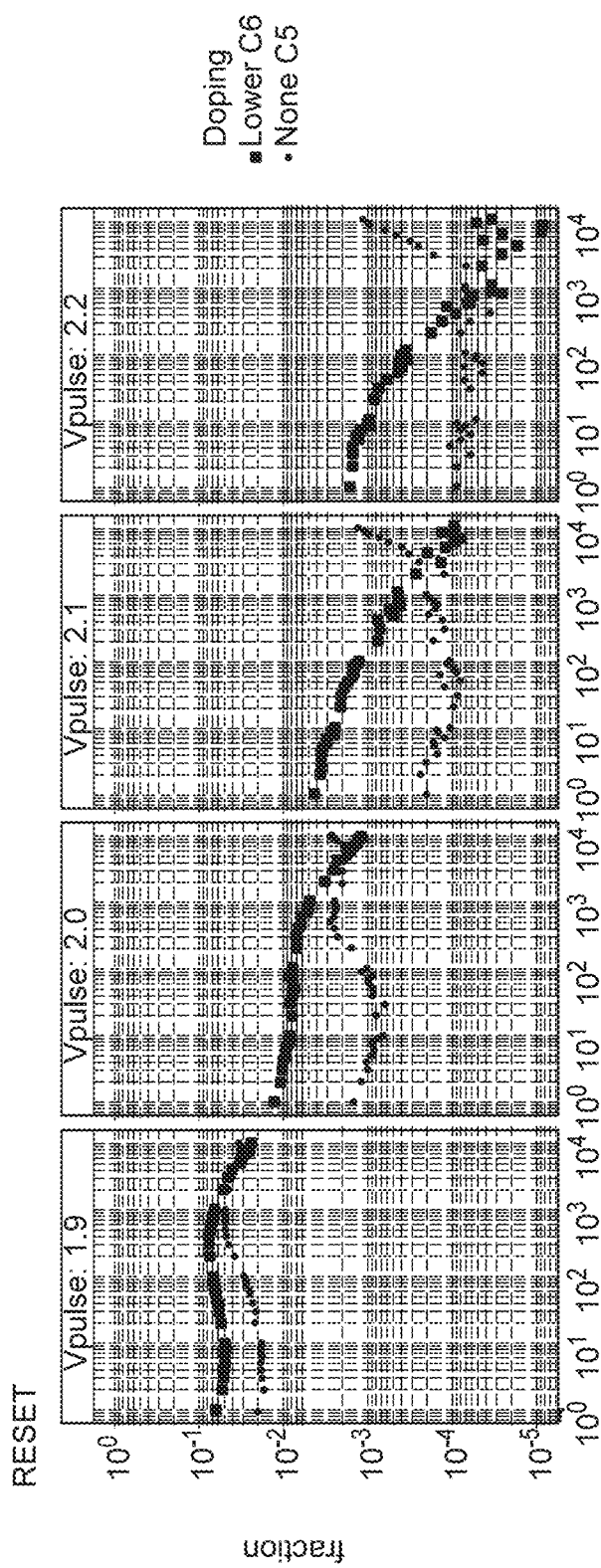

FIGS. 11 and 12 illustrate another benefit of OxRAM-type memory cells according to an embodiment of the invention. These figures are based on the so-called "intelligent programming" mechanism. This method consists in checking, after each operation, that the memory cell has the resistance level corresponding to the state in which it has been programmed (set or reset). If this is not the case, the programming operation (set or reset) is repeated as many times as needed until a resistance level in accordance with expectations is obtained: the number of iterations required is called repetition. More precisely, in FIG. 11 (set), repetition consists in repeating the same set pulse. In FIG. 12 (reset), repetition consists in increasing the pulse voltage with each repetition.

Thus, FIG. 11 shows the fraction of memory cells according to an embodiment of the invention C6 and of memory cells without implantation of the lower electrode C5 that had to be reprogrammed with a given number of repetitions (ranging from 2 to 5) for set operations as a function of the number of cycles. Byway of example, it can be seen that in the case where two repetitions are needed, there is approximately one cell in 10,000 of type C5 or C6 which has been rewritten twice in the $100^{th}$ cycle. FIG. 12 shows the fraction of memory cells according to an embodiment of the invention C6 and of memory cells without implantation of the lower electrode C5 that had to be reprogrammed with a given number of repetitions (ranging from 2 to 5) for reset operations as a function of the number of cycles.

In the case of reset operations (FIG. 12), it can be noticed that the more cycling operations are carried out with memory cells C6 according to an embodiment of the invention, the fewer reprogramming pulses need to be added. Conversely, C5 type memory cells with an undoped lower electrode require more repetitions beyond about one hundred cycles. This first result confirms the very good endurance limit of the memory cells according to an embodiment of the invention. Indeed, the fact that the memory cells are less "stressed" due to the lower number of needed repetitions results in better endurance of the memory cells.

In the case of set operations (FIG. 11), some stability is observed, again confirming the endurance performance of the memory cells according to an embodiment of the invention.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

As used herein in the specification and in the claims, the phrase "at least one", in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

A person skilled in the art will readily appreciate that various features, elements, parameters disclosed in the description may be modified and that various embodiments disclosed may be combined without departing from the scope of the invention. For example, various aspects of the present disclosure may be used alone, in combination, or in a variety of arrangements not specifically described in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Having described above several aspects of at least one embodiment, it is to be appreciated various alterations, modifications, and improvements will readily occur to those skilled in the art. Such alterations, modifications, and improvements are intended to be aspects of this disclosure. Accordingly, the foregoing description and drawings are by way of example only.

What is claimed is:
1. A method for manufacturing an OxRAM-type resistive memory cell, comprising:
   forming a titanium nitride lower electrode,
      firstly implanting silicon atoms into the lower electrode with a first implantation dose of silicon and a first implantation acceleration voltage, said first implantation dose of silicon being strictly positive and strictly lower than $0.7 \times 10^{14}$ cm$^{-2}$
      secondly implanting silicon atoms into the lower electrode with a second implantation dose of silicon and a second implantation acceleration voltage strictly greater than the first implantation acceleration voltage, said second implantation dose of silicon being strictly positive and strictly lower than $0.6 \cdot 10^{14}$ cm$^{-2}$
   the first and second acceleration voltages being selected to have an implantation profile following the first and second implantations having a maximum silicon concentration at a depth of between 1 and 3 nm from the upper surface of the lower electrode,
   depositing an active layer onto the lower electrode implanted, and
   depositing an upper electrode onto the active layer.
2. The method according to claim 1, wherein the first and second acceleration voltages are selected to have an implantation profile following the first and second implantations having a maximum silicon concentration at a depth of between 1 and 1.6 nm from the upper surface of the lower electrode and a width of the implantation profile at half the value of the maximum silicon implantation concentration of between 1.6 nm and 2 nm.

3. The method according to claim 2, wherein the first and second acceleration voltages are selected to have an implantation profile following the first and second implantations having a maximum silicon concentration at a depth of between 1.1 and 1.5 nm from the upper surface of the lower electrode and a width of the implantation profile at half the value of the maximum silicon implantation concentration of between 1.7 nm and 1.9 nm.

4. The method according to claim 1, wherein depositing the upper electrode onto the active layer comprises:
   depositing a first conductive layer, in contact with the active layer and being selected to create oxygen vacancies in the active layer, and
   depositing a second conductive layer disposed onto the first conductive layer.

5. The method according to claim 4, wherein the material of the first conductive layer is titanium and the conductive material of the second conductive layer is titanium nitride.

6. The method according to claim 1, wherein the first acceleration voltage is between 0.3 kV and 0.7 kV and the second acceleration voltage is between 1 kV and 2 kV.

7. The method according to claim 1, wherein the first acceleration voltage is equal to 0.5 kV and the second acceleration voltage is equal to 1.5 kV.

8. The method according to claim 1, wherein the first implantation dose of silicon is equal to $0.5 \cdot 10^{14}$ cm$^{-2}$ and the second implantation dose of silicon is equal to $0.3 \cdot 10^{14}$ cm$^{-2}$.

9. The method according to claim 1, wherein depositing the active layer onto the lower electrode implanted includes:
   depositing an active material layer onto the lower electrode implanted,
   depositing a dielectric oxide layer onto the active material layer,
   implanting silicon atoms through the dielectric oxide layer, the implantation dose and the implantation acceleration voltage being selected so that the silicon atoms are implanted at least partially into the active material layer.

10. The method according to claim 9, wherein the active material is based on hafnium dioxide.

11. The method according to claim 9, wherein the dielectric oxide is based on aluminium oxide.

12. The method according to claim 6, wherein implanting silicon through the dielectric oxide layer is implemented at an implantation acceleration voltage of between 1.5 and 3.5 kilovolts, and an implantation dose of silicon of between $10^{15}$ cm$^{-2}$ and $5 \cdot 10^{15}$ cm$^{-2}$.

13. The method according to claim 12, wherein the implantation acceleration voltage is equal to 2.5 kV, and the implantation dose of silicon is equal to $2 \cdot 10^{15}$ cm$^{-2}$.

14. The method according to claim 1, wherein a thickness of the titanium nitride lower electrode is selected between 10 and 200 nm.

15. An OxRAM-type memory cell obtained by the method according to claim 1.

* * * * *